United States Patent
Marty et al.

(10) Patent No.: US 7,476,574 B2
(45) Date of Patent: Jan. 13, 2009

(54) METHOD FOR FORMING AN INTEGRATED CIRCUIT SEMICONDUCTOR SUBSTRATE

(75) Inventors: Michel Marty, Varces (FR); Grégory Avenier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 441 days.

(21) Appl. No.: 11/335,857

(22) Filed: Jan. 19, 2006

(65) Prior Publication Data

US 2006/0189157 A1 Aug. 24, 2006

(30) Foreign Application Priority Data

Jan. 21, 2005 (FR) .................................. 05 00674

(51) Int. Cl.
*H01L 21/336* (2006.01)
*H01L 21/20* (2006.01)

(52) U.S. Cl. .............................. 438/149; 438/479
(58) Field of Classification Search .............. 438/479, 438/149, 164, 421, 422
See application file for complete search history.

(56) References Cited

U.S. PATENT DOCUMENTS

| | | | |
|---|---|---|---|
| 5,120,666 A * | 6/1992 | Gotou ......................... | 438/164 |
| 5,461,253 A * | 10/1995 | Tsuruta et al. .............. | 257/501 |
| 6,004,837 A * | 12/1999 | Gambino et al. ............ | 438/157 |
| 6,333,532 B1 | 12/2001 | Davari et al. | |
| 6,346,735 B1 | 2/2002 | Ueyanagi et al. | |
| 6,429,477 B1 * | 8/2002 | Mandelman et al. ........ | 257/301 |
| 6,461,903 B2 * | 10/2002 | Lee .............................. | 438/164 |
| 6,515,333 B1 * | 2/2003 | Riccobene ................... | 257/347 |
| 6,537,862 B2 * | 3/2003 | Song ............................ | 438/157 |
| 6,586,284 B2 * | 7/2003 | Kim ............................. | 438/149 |
| 6,617,223 B2 * | 9/2003 | Wilson et al. ............... | 438/404 |
| 6,693,294 B1 * | 2/2004 | Jang et al. ................... | 257/30 |
| 6,713,356 B1 * | 3/2004 | Skotnicki et al. ........... | 438/285 |
| 6,717,216 B1 * | 4/2004 | Doris et al. .................. | 257/347 |
| 6,774,017 B2 * | 8/2004 | Brown et al. ................ | 438/480 |
| 6,794,306 B2 * | 9/2004 | Kim et al. .................... | 438/752 |
| 6,830,987 B1 * | 12/2004 | Pelella et al. ................ | 438/421 |
| 6,943,087 B1 * | 9/2005 | Xiang et al. ................. | 438/311 |
| 6,955,988 B2 * | 10/2005 | Nevin et al. ................. | 438/700 |
| 6,965,147 B2 * | 11/2005 | Shino .......................... | 257/347 |
| 6,982,460 B1 * | 1/2006 | Cohen et al. ................. | 257/331 |
| 7,018,873 B2 * | 3/2006 | Dennard et al. ............. | 438/149 |
| 7,029,964 B2 * | 4/2006 | Cheng et al. ................. | 438/197 |

(Continued)

FOREIGN PATENT DOCUMENTS

EP 1 246 248 10/2002

OTHER PUBLICATIONS

Preliminary French Search Report, FR 05 00674, dated Jul. 18, 2005.

*Primary Examiner*—M. Wilczewski
(74) *Attorney, Agent, or Firm*—Gardere Wynne Sewell LLP

(57) ABSTRACT

An integrated circuit semiconductor substrate includes an active silicon layer separated from a silicon substrate layer by a buried insulating material layer. The active silicon layer, however, locally includes at least one over-thickness on the side of the buried layer, while maintaining a flat surface state of the semiconductor layer across the integrated circuit. The over-thickness is created by forming a cavity under the active silicon layer in the local area, and then providing the over-thickness by partially filling the cavity at the bottom of the active silicon layer through epitaxial growth. An insulating layer then fills the remaining portions of the cavity.

10 Claims, 4 Drawing Sheets

U.S. PATENT DOCUMENTS

| | | |
|---|---|---|
| 7,033,868 B2 * | 4/2006 | Nakamura et al. .......... 438/149 |
| 7,033,869 B1 * | 4/2006 | Xiang et al. ................ 438/149 |
| 7,151,034 B2 * | 12/2006 | Lee et al. ................... 438/300 |
| 7,326,603 B2 * | 2/2008 | Kanemoto .................. 438/152 |
| 7,396,733 B2 * | 7/2008 | Kanemoto .................. 438/400 |
| 2002/0167050 A1 | 11/2002 | Brown et al. |
| 2002/0177282 A1 * | 11/2002 | Song ......................... 438/300 |
| 2003/0215989 A1 * | 11/2003 | Kim ........................... 438/157 |
| 2004/0253792 A1 * | 12/2004 | Cohen et al. ................ 438/400 |
| 2005/0037582 A1 * | 2/2005 | Dennard et al. ............. 438/281 |
| 2005/0110078 A1 * | 5/2005 | Shino ......................... 257/331 |
| 2005/0224889 A1 * | 10/2005 | Oh et al. ..................... 257/369 |
| 2006/0138541 A1 * | 6/2006 | Nakamura et al. .......... 257/347 |
| 2006/0189157 A1 * | 8/2006 | Marty et al. ................ 438/778 |
| 2007/0075317 A1 * | 4/2007 | Kato et al. ................... 257/74 |
| 2007/0080402 A1 * | 4/2007 | Kato .......................... 257/351 |
| 2007/0117334 A1 * | 5/2007 | Nayfeh et al. ............... 438/301 |
| 2008/0099849 A1 * | 5/2008 | Kim et al. ................... 257/365 |
| 2008/0102633 A1 * | 5/2008 | Matsuzawa ................. 438/691 |
| 2008/0145999 A1 * | 6/2008 | Kato .......................... 438/401 |
| 2008/0146017 A1 * | 6/2008 | Kato .......................... 438/618 |
| 2008/0203484 A1 * | 8/2008 | Hofmann et al. ............ 257/369 |
| 2008/0217653 A1 * | 9/2008 | Sonsky ....................... 257/190 |

* cited by examiner

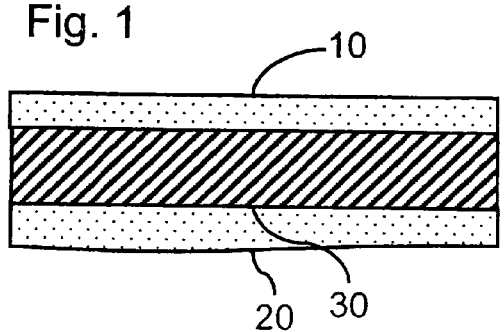
Fig. 1
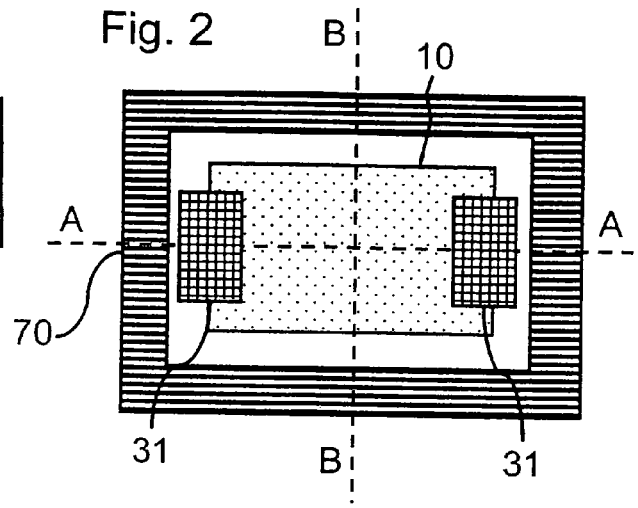
Fig. 2
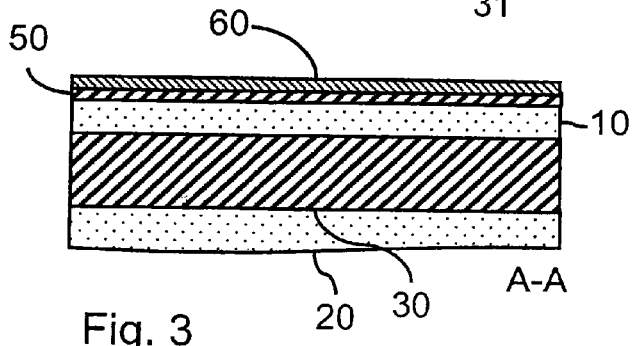
Fig. 3
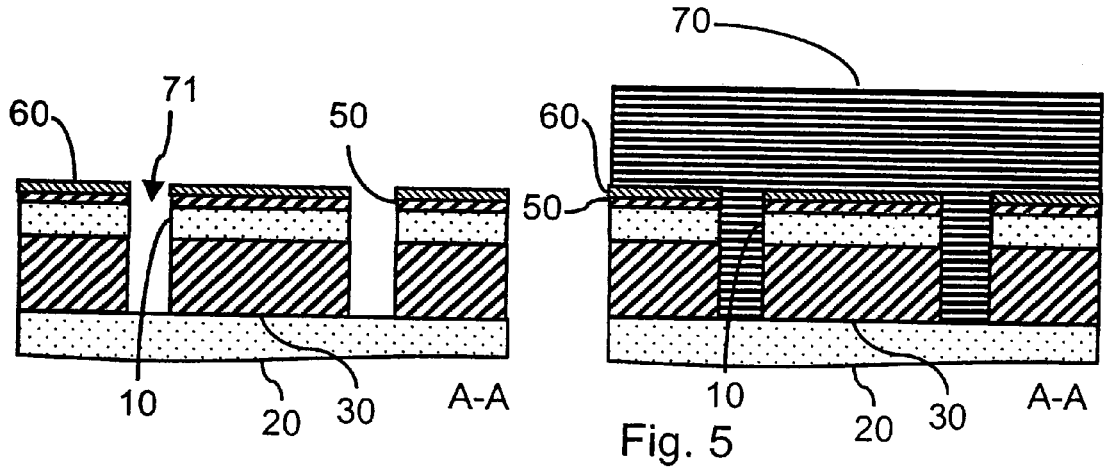
Fig. 4
Fig. 5

METHOD FOR FORMING AN INTEGRATED CIRCUIT SEMICONDUCTOR SUBSTRATE

PRIORITY CLAIM

The present application claims priority from French Application for Patent No. 05 00674 filed Jan. 21, 2005, the disclosure of which is hereby incorporated by reference.

BACKGROUND OF THE INVENTION

1. Technical Field of the Invention

The present invention, in general, relates to the field of semiconductor integrated circuits. In particular, this invention relates to improving the compatibility of a Silicon-On-Insulator (SOI) type semiconductor substrate with different integrated circuit manufacturing technologies in the perspective of joining analog-digital mixed circuits onto the same substrate of the type mentioned above.

2. Description of Related Art

SOI (Silicon-On-Isolator) type substrates have been developed within the framework of the CMOS SOI technology.

As illustrated in diagram form in FIG. 1, an SOI substrate is normally composed of a very thin layer 10 of monocrystalline silicon, with a thickness of, for example, approximately 160 nm, separated from the substrate layer 20, for example made of silicon, by a layer 30 of buried insulating material (silicon oxide, for example), with a thickness of, for example, approximately 400 nm. Other pairs of silicon thicknesses and insulating oxide thicknesses are of course possible. SOI transistors are formed in the thin layer 10 of silicon, called the active layer. The active area of the transistor is therefore delimited laterally by a structure, for example, made of silicon oxide, encased in the surface of the active layer 10, which is currently designated in the technique by STI (Shallow Trench Isolation.)

Thanks to the buried oxide layer to be placed below the thin active layer of silicon, high-resistance substrates can be used. These substrates allow for reducing electric leaks and significantly decreasing the proximity parasite coupling between circuits created on the same substrate. This characteristic is particularly advantageous in the manufacturing of mixed analog-digital circuits on the same silicon chip, in particular, within the application framework that requires components operating at high frequencies. The SOI technology also allows for creating MOS type field effect transistors with greater dynamic characteristics than with respect to traditional CMOS technology (called bulk), in addition to presenting other specific advantages, such as a lower power supply voltage.

The potential capabilities of SOI technology therefore create a technology that is specifically adapted to high-performance applications that require low consumption, in particular, in the portable electronic device and wireless communications market.

Nevertheless, for these applications, the miniaturization of systems is heading towards integrated circuits that contain all of the functions included in a single chip, instead of having specific separate integrated circuits for creating each module. Currently, analog components that provide high-frequency, for example, bipolar transistors, are difficult to integrate into an SOI substrate.

Indeed, at the SOI substrate level, the active silicon layer, normally less than 200 mn, is much too thin to accommodate current vertical bipolar transistors. Thus, when such a transistor is to be operated at high frequency, it can be observed that one of the main limiting parameters resides in the low thickness of the active silicon layer. Therefore, the behavior of this type of component built on an SOI type substrate is thus modified, and in particular, their operating speed is degraded.

The behavior of other types of components is also modified when they are built on an SOI type based silicon substrate, which is normally adapted for CMOS components.

The specific structure of the SOI substrate therefore leads to its use being dedicated to CMOS technology. SOI use is not currently foreseeable for accepting all integrated circuit technologies because of the above-mentioned issues. This can be particularly damaging in the perspective of integrating mixed analog-digital circuits on the same SOI substrate.

To counter the limiting characteristics of the thinness of the active silicon layer for building certain devices, the thickness of this layer, whose thickness is normally fixed along the entire surface of the substrate, could be increased locally in places on the substrate where the devices in question must be placed. These variable thickness areas can be formed on the desired locations by selective epitaxial growth on the top active layer of the substrate. With this method, however, silicon steps (i.e., elevation changes) are obtained on the substrate surface.

In this way, an SOI substrate can be obtained that presents, at certain locations, a variable silicon thickness on the insulator. Nevertheless, the surface of the substrate thus obtained will no longer be flat, which presents another problem. This is particularly an issue when implementing certain post-manufacturing stages that require performing a chemical-mechanical polishing (CMP) step, as there would be a risk of clipping the components due to the difference in topography thus created on the substrate.

A need accordingly exists to allow for locally varying the thickness of the active silicon layer in an SOI substrate, while still maintaining the typical characteristics of the insulated substrate of this type of substrate and further maintaining the flatness of the surface state of this substrate.

Embodiments of the present invention provide a method for obtaining such a substrate.

SUMMARY OF THE INVENTION

To address the foregoing and other needs in the art, and achieve the noted goals, an embodiment of the present invention comprises an integrated circuit semiconductor substrate that includes an active silicon layer separated from a silicon substrate layer by a layer of buried insulating material. The active silicon layer locally includes at least one over-thickness on the side of said buried layer, so that the semiconductor substrate includes a substantially flat top surface state.

Advantageously, the substrate includes means for electrical insulation of the local over-thickness area of the active layer with respect to the rest of said active layer.

Preferably, said insulating material of said buried layer is made of silicon oxide.

An embodiment of the present invention also relates to an integrated circuit, wherein that integrated circuit is built on a semiconductor substrate having the charateristics described above.

The invention also relates to a method for forming an over-thickness in the active layer of an integrated circuit semiconductor layer that includes a substrate layer separated from said active layer by a buried layer of insulating material; this method comprises the following steps: locally delimiting an area of said active layer where the thickness must be increased by creating deep insulation trenches that extend from the surface of said active layer to the substrate layer, accessing the section of the buried layer located underneath the delimited area of the active layer, eliminating the portion of buried layer by isotropic etching, so that a cavity is formed underneath the active layer, and increasing through epitaxy the active layer area to the cavity thus formed, so that the thickness of the active layer is increased at the bottom.

Advantageously, the remaining cavity volume is filled with an insulating type material.

According to one embodiment, the active layer is the silicon layer doped according to a chosen conductivity type; the epitaxial growth towards the bottom of the active layer is performed by a silicon epitaxy with the same type of conductivity than that of the active layer.

According to another embodiment, the active layer is a silicon layer doped according to a chosen conductivity type; the epitaxial growth towards the bottom of the active layer is performed by a silicon epitaxy with a type of conductivity that is the reverse of that of the active layer.

Advantageously, the creation of deep insulation includes previously depositing a hard mask on the semiconductor substrate; this hard mask will later be used as a mechanical support for the active layer area when the cavity embedded in the active layer area is formed.

Preferably, the hard mask is formed by an oxide-nitride bilayer.

In accordance with an embodiment, a method comprises forming an SOI structure including a substrate silicon layer, an insulating layer overlying the substrate silicon layer and a doped silicon layer overlying the insulating layer. The insulating layer beneath an active area of the doped silicon layer is excavated to form a cavity. A depth of the doped silicon layer is increased, with the increased depth partially filling the cavity. The increased depth doped silicon layer is then insulated from the substrate silicon layer with a formed insulator in the cavity.

In accordance with another embodiment, an integrated circuit comprises an SOI structure including a substrate silicon layer, an insulating layer overlying the substrate silicon layer having a first thickness and a doped silicon layer overlying the insulating layer having a second thickness. An active region delimited within the SOI structure has the insulating layer with a third thickness which is less than the first thickness, and the doped silicon layer with a fourth thickness which is greater than the third thickness.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1, already described, is a cross-sectional diagram view of the various layers of an SOI type substrate;

FIG. 2 illustrates a top view of a substrate area where the local thickness of the active layer will be increased according to this invention, with the specific elements that will be necessary in order to perform this over-thickness;

FIGS. 3 to 13 are cross-sectional views that illustrate the successive steps of a manufacturing embodiment according to this invention for an SOI layer with a local over-thickness towards the bottom; that is, on the side of the buried oxide layer;

DETAILED DESCRIPTION OF THE DRAWINGS

Figure 6:
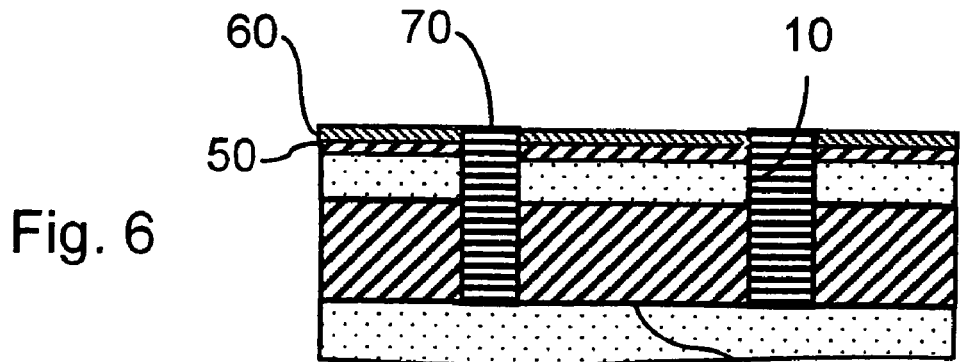

The following description will describe the fabrication stages that allow obtaining, at the level of an SOI substrate, a localized area in which the active silicone layer presents an over-thickness in the direction of the buried insulating layer. FIG. 2 illustrates particularly a top view of this area 10. On this figure, there are also structural modifications that should be made on the substrate in order to be able to obtain the desired over-thickness. These modifications include, particularly, deep insulation trenches 70 and trenches 31 for accessing the buried oxide layer, whose interest will be described in more detail in the following figures.

Thus, FIGS. 3 to 6 illustrate, more specifically in a cross-sectional view (cut A-A in FIG. 2), the subsequent stages for creating deep insulation trenches. Therefore, according to this invention, this refers to creating deep insulation trenches or DTI (Deep Trench Insulation), for delimiting and enveloping the active layer area where the over-thickness is to be made.

As illustrated in FIG. 3, a traditional SOI substrate is used with the following stacking of layers: the substrate layer 20, for example made of silicon, the buried silicon oxide layer 30 and the active silicon layer 10 that is lightly doped, for example a P type layer. On layer 10, an oxide layer 50 is placed, for example using chemical vapor deposition (CVD), followed by a nitrate layer 60. The oxide-nitrate bilayer will advantageously serve as a mask during the subsequent phase of etching deep insulation trenches, such as those illustrated in FIG. 4, by compensating for the erosion phenomenon of the initial resin mask.

At the stage illustrated in FIG. 4, an opening 71 is therefore made in the SOI substrate, enveloping the active layer area 10 where an over-layer is to be created, until the silicon substrate layer 20 is reached. In practice, after lithography of the locations in question, an initial vertical anisotropic etching is made on the silicon layer 10, then a second vertical anisotropic etching is made on the oxide layer 30 until the silicon region 20 is reached.

At the stage illustrated in FIG. 5, the trenches created in the previous stage are filled. This filling is performed by depositing a poly-silicon layer 70 (or perhaps other material) so that it fills the trenches. FIG. 6 then illustrates the result of a chemical mechanical polishing (CMP) stage of the layer 70 which stops at the nitrate layer 60, and which allows taking layer 70 to the hard oxide-nitrate mask 50-60. The deep insulation trenches thus filled allow for delimiting the area in which the buried oxide portion located under the active layer will then be removed in order to increase its thickness near the bottom.

Figure 7:
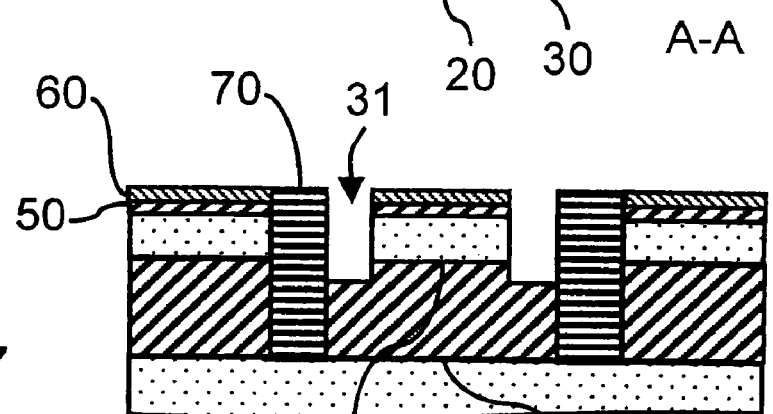

To do this, as illustrated in FIG. 7, according to the A-A view, firstly, two openings 31 are made that extend to the buried silicon oxide layer 30, thus acting as trenches for accessing this buried layer 30. These openings are made through layers 60, 50, and 10 by making successive vertical anisotropic plasma type etches, until reaching the buried oxide layer 30.

Figure 8:
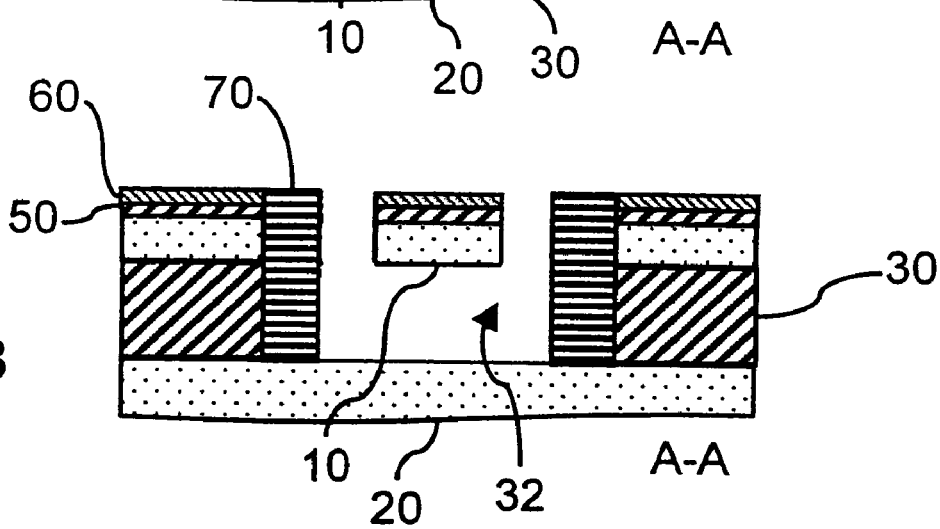

Then, at the stage illustrated in FIG. 8, still according to the A-A view, an isotropic etching is made using a product that selectively etches the silicon oxide, in order to completely eliminate the buried silicon oxide layer 30 portion delimited by the deep insulation trenches 70 and in order to form a cavity 32 under the active layer 10 in the area that was cut by this portion of the layer. To do this, there are selective etching isotropic methods for silicon oxide based on damp steam chemistry. During this stage, it is of interest to have deep trenches in poly-silicon and which advantageously prevent the isotropic etching from propagating sideways along the buried oxide. Therefore, a cavity 32 under the silicon layer 5 has been correctly defined locally.

Figure 9:
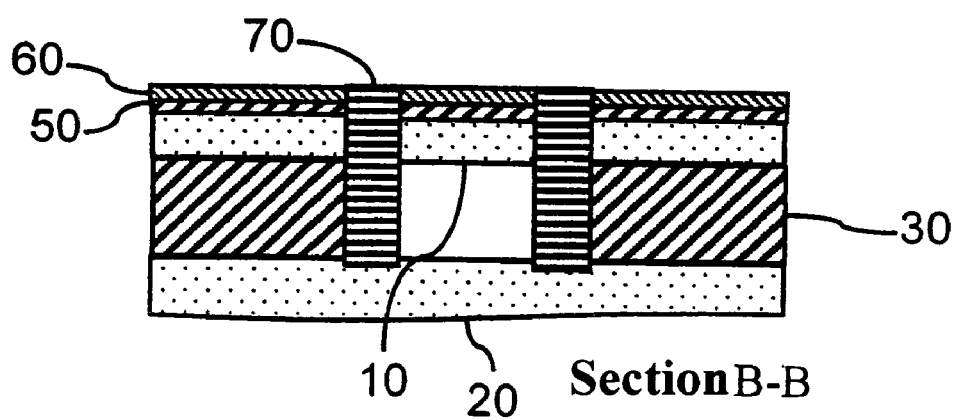

FIG. 9 illustrates a lengthwise cross-sectional view (based on the B-B axis in FIG. 2) that corresponds to the view in FIG. 8, and shows that the active layer 10 that appears to float in FIG. 8 below the previously created cavity 32 is in fact maintained in its other dimension according to the B-B axis by the oxide-nitrate-silicon layer that works as a "bridge." The oxide-nitrate bilayer therefore has a dual function. Indeed, it serves as a hard mask at the beginning of the method when the deep insulation trenches are being created, as well as a mechanical support for the active silicon layer when the cavity 32 is formed under the active layer.

Figure 10:
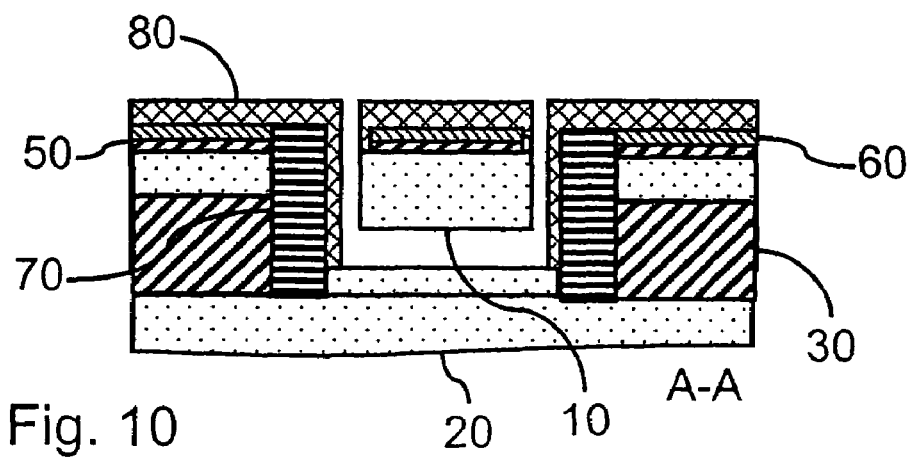

Then, as illustrated in FIG. 10, again based on the A-A view (as in the following figures), a silicon epitaxial growth is performed in order to thicken the active silicon layer towards the bottom in the direction of the previously created cavity 32. According to the embodiment example, a non-selective epitaxy is performed by chemical vapor deposition, doped in the same manner as the active silicon layer 10. In a variant, a silicon epitaxy is performed doped in the reverse (N type epitaxy according to the example) of the doping of the active silicon layer 10.

This type of epitaxy allows for increasing the active silicon layer 10, in the same way as the silicon substrate layer 20 at the bottom of the cavity 32 by maintaining the monocrystalline continuity of these layers. On the other hand, a polycrystalline silicon layer 80 increases at the level of layers that are not the silicon layers; that is, at the nitrate layer 60 level and the polysilicon layer 70 level.

Therefore, the active silicon layer 10 is thickened at the bottom. The desired over-thickness is easily controlled during the epitaxy phase according to the epitaxy formation time of the silicon layer. Taking into account the simultaneous increase of the active silicon layer 10 and the silicon substrate layer 20 located at the bottom of the cavity 32, the thickness of the active layer can increase by almost half the thickness of the buried oxide layer that was previous removed; while considering that a minimum space must be maintained between the active layer 10 and the substrate 20 in order to recreate the characteristic insulation layer of SOI. In other words, during the epitaxy phase, the two silicon layers 10 and 20 must not be joined.

Figure 11:
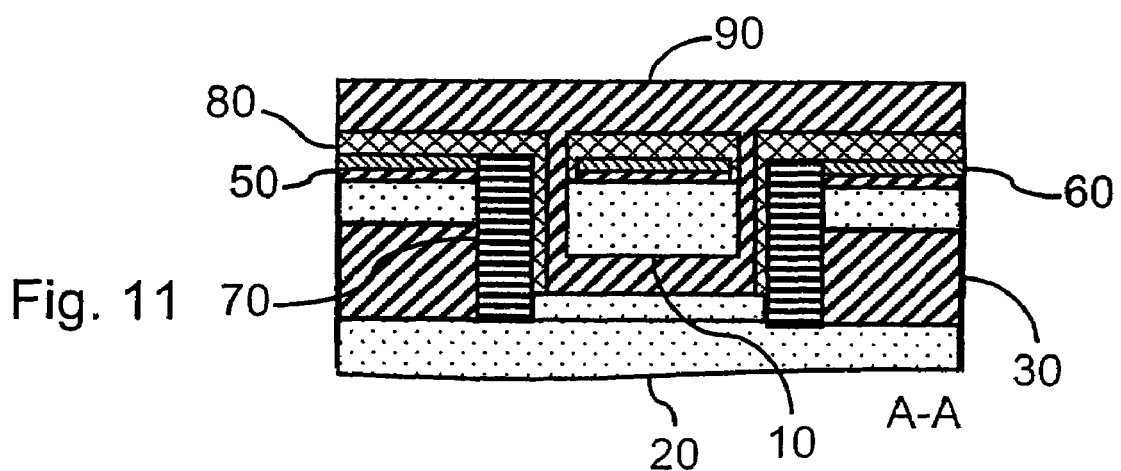

As illustrated in FIG. 11, the stage that follows the epitaxial silicon increase stage comprises depositing a new oxide layer 90, designed to fill the part of the cavity 32 that is not occupied under the thickened active silicon layers 10/20. This way, a buried oxide layer 30 is recreated under the thickened active silicon layer.

Figure 12:
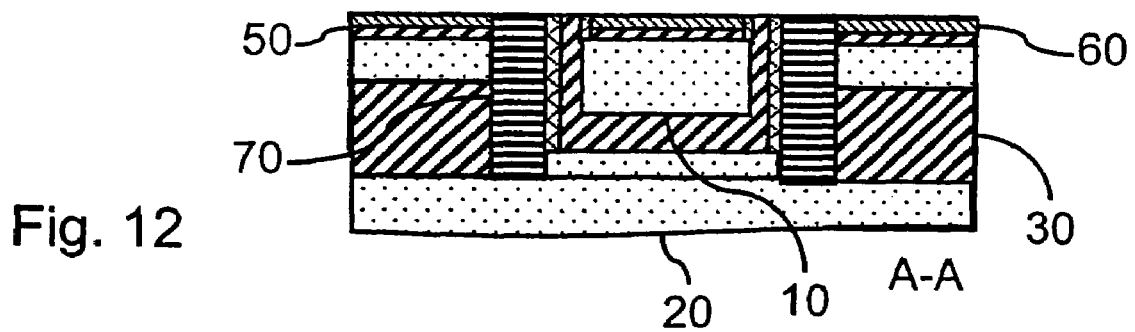

Then, as illustrated in FIG. 12, a chemical mechanical polishing (CMP) stage is implemented, which comprises removing the surplus of the previously deposited oxide layer 90, as well as the polycrystalline silicon layer created during the epitaxy increase stage.

Figure 13:
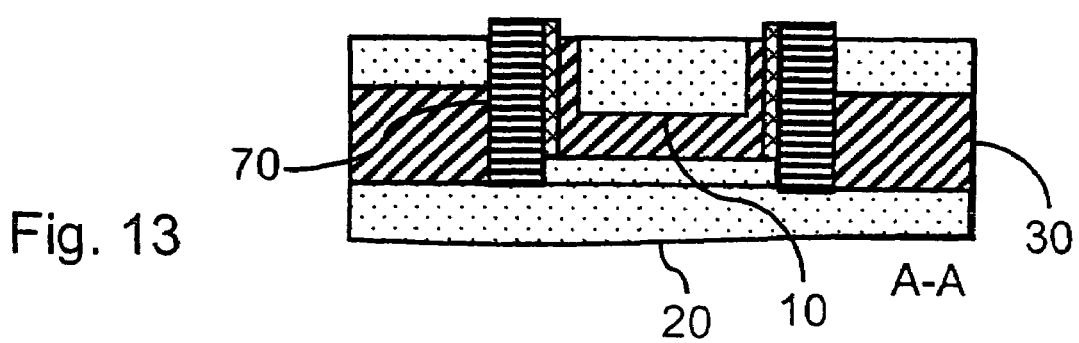

Lastly, as illustrated in FIG. 13, the oxide-nitrate bilayer 50-60 is removed, also using selective chemistry.

At this stage, the subsequent stages of those described above allow for the obtaining of an SOI type substrate whose surface status is noticeably flat, while locally (delimited by deep insulation trenches 70) presenting an over-thickness of the active silicon layer 10 at the buried oxide layer 30 side.

The area thus created must now be insulated from the rest of the substrate. Indeed, if viewed in the other dimension of the substrate based on the B-B axis, it can be observed that the over-thickened area of the active layer has continuity with the rest of the active layer of the substrate because of the deep insulation trenches 70. This problem is solved by starting the rest of the normal steps for preparing STI insulation trenches implemented within the framework of the standard CMOS SOI technology.

Figure 14:
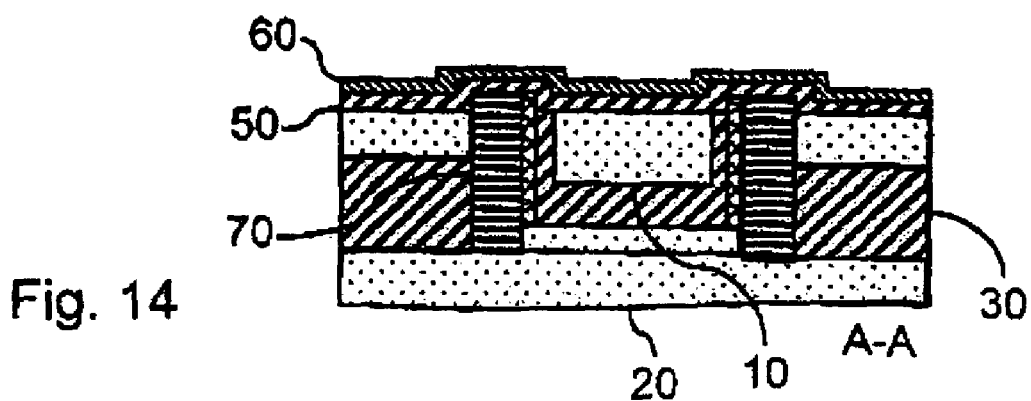
FIGS. 14 to 16 are cross-sectional views that illustrate the standard preparation steps of an SOI substrate.
Figure 15:
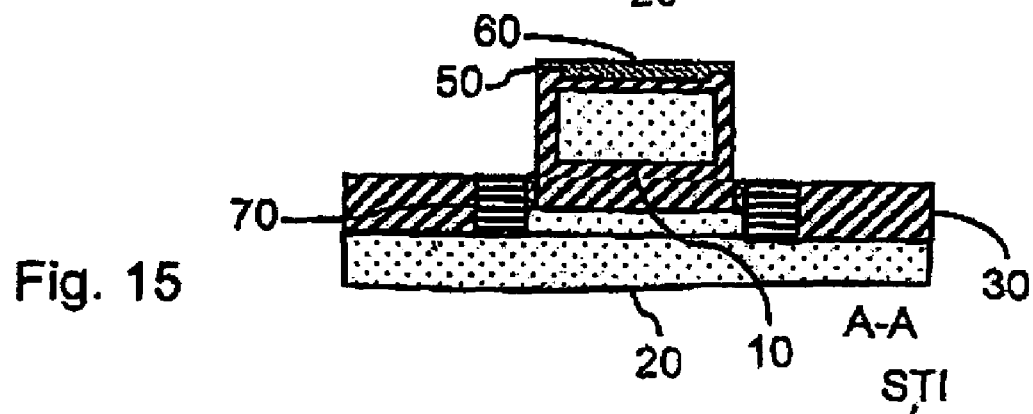

To do this, as illustrated in FIG. 14, a hard mask formed by an oxide-nitrate bilayer 50-60 is again deposited. Then, as illustrated in FIG. 15, after a lithography stage of the active area 10 in question, the SOI substrate is etched until the buried oxide layer 30 is reached.

Figure 16:
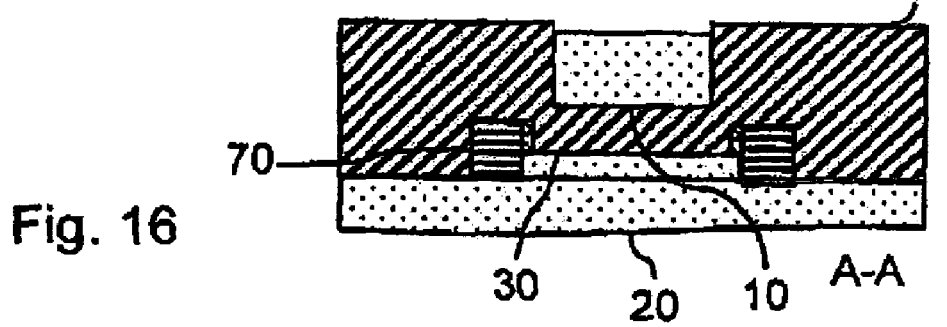

As illustrated in FIG. 16, after depositing an oxide layer for filling the STIs around the thickened oxide layer, the surplus of this oxide layer is removed by CMP until the nitrate layer 60 is reached. Then, a chemical removal of the hard oxide-nitrate mask that covers the over-thickened area 10 is removed. This creates a small gap at the top of the silicon layer 10 with respect to the STIs, which is inherent to the employed technology.

Figure 17:
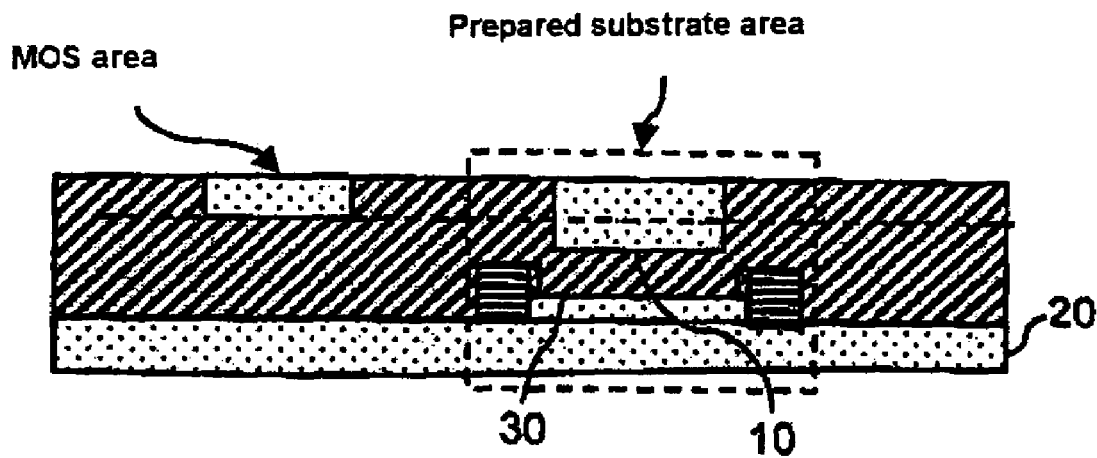
FIG. 17 represents a side-cut view of a prepared SOI substrate that includes an area modified according to this invention, wherein at the level of the modified area of the substrate, the active silicon layer includes an over-thickness in the direction of the buried insulating layer.

Nevertheless, as illustrated in FIG. 17, the substrate obtained at the end has a noticeably flat surface, despite the presence of any small gap mentioned above, with a substrate area prepared locally, completely electrically insulated by the STIs, where the active silicon layer has an over-thickness at the buried oxide layer side. This over-thickened layer advantageously co-resides on the same SOI substrate with the non-prepared areas with a this standard active silicon layer, which are normally designed to accept MOS transistors.

The characteristics of the invention are based on local over-thicknesses of the active silicon layer without a difference in topography on the SOI substrate surface and allow, for example, creating vertical bipolar transistors on an SOI substrate while maintaining their operating characteristics and therefore makes it much easier to implement BI-CMOS circuits on the same SOI substrate.

Of course, the use of the SOI substrate prepared according to this invention is not limited to the manufacture of bipolar transistors. This type of substrate can also be used, for example, for manufacturing LDMOS power transistors, for which the reduced thickness of the active silicon layer of standard SOI substrates is also a problem.

Generally, at the level of the SOI substrate area prepared according to the invention, any semiconductor device, whose behavior may be affected or limited if it were built on a non-prepared SOI substrate and presenting a reduced thickness of the active silicon layer on the entire surface, can be built.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for forming an over-thickness in the active layer of an integrated circuit semiconductor substrate that includes a substrate layer separated from said active layer by a buried layer made of insulating material, comprising:

locally delimiting an area of said active layer where a thickness must be increased by creating deep insulation trenches that extend from a surface of said active layer to the substrate layer, accessing a section of the buried layer located underneath the delimited area of the active layer, eliminating a portion of the buried layer by isotropic etching so that a cavity is formed underneath the active layer, increasing through epitaxy the active layer area in the cavity thus formed, so that the thickness of the active layer is increased at its bottom.

2. The method according to claim 1, wherein a remaining cavity volume is filled with an insulating type material.

3. The method according to claim 1, wherein the active layer is a silicon layer doped according to a chosen conductivity type, and the epitaxial growth towards the bottom of the active layer is performed by a silicon epitaxy with a same type of conductivity as the chosen conductivity type of the active layer.

4. The method according to claim 1, wherein the active layer is a silicon layer doped according to a chosen conductivity type, and the epitaxial growth towards the bottom of the active layer is performed by a silicon epitaxy with a type of conductivity that is an opposite conductivity type from the chosen conductivity type of the active layer.

5. The method according to claim 1, wherein the creation of deep insulation trenches includes previously depositing a hard mask on the semiconductor substrate, this hard mask later being used as a mechanical support for the active layer area when the cavity is formed.

6. The method according to claim 5, wherein the hard mask is formed by an oxide-nitride bilayer.

7. A method, comprising:

forming an SOI structure including a substrate silicon layer, an insulating layer overlying the substrate silicon layer and a doped silicon layer overlying the insulating layer;

excavating the insulating layer beneath an active area of the doped silicon layer to form a cavity;

increasing a depth of the doped silicon layer, the increased depth partially filling the cavity; and insulating the increased depth doped silicon layer from the substrate silicon layer with a formed insulator in the cavity.

8. The method of claim 7 wherein increasing the depth of the doped silicon layer comprises performing an epitaxial growth of the doped silicon layer.

9. The method of claim 7 wherein the doped silicon layer as originally formed and as formed by increasing the depth are of the same conductivity type.

10. The method of claim 7 wherein the doped silicon layer as originally formed and as formed by increasing the depth are of different conductivity types.

* * * * *